(12) United States Patent
Nakamura

(10) Patent No.: US 7,643,284 B2
(45) Date of Patent: Jan. 5, 2010

(54) HOUSING TEMPERATURE SUPPRESSING STRUCTURE IN ELECTRONIC DEVICE AND PORTABLE COMPUTER

(75) Inventor: Fusanobu Nakamura, Yamato (JP)

(73) Assignee: Lenovo Singapore Pte. Ltd, Singapore (SG)

( * ) Notice: Subject to any disclaimer, the term of this patent is extended or adjusted under 35 U.S.C. 154(b) by 83 days.

(21) Appl. No.: 11/927,381

(22) Filed: Oct. 29, 2007

(65) Prior Publication Data

US 2008/0112130 A1      May 15, 2008

(30) Foreign Application Priority Data

Oct. 30, 2006   (JP) .............. 2006-293408

(51) Int. Cl.
*H05K 7/10* (2006.01)
*G06F 1/20* (2006.01)

(52) U.S. Cl. .............. 361/679.47; 361/679.48; 361/679.5; 361/679.52; 361/679.54; 361/679.55; 361/695; 361/697; 361/700; 361/702; 361/704; 165/80.4; 165/104.33; 165/185

(58) Field of Classification Search ................. 361/679.46–679.55, 690, 692, 694–695, 361/697, 699–700, 702–704; 165/80.3–80.5, 165/104.33, 185; 174/15.2, 16.1, 16.3; 454/184
See application file for complete search history.

(56) References Cited

U.S. PATENT DOCUMENTS

| | | | |
|---|---|---|---|
| 6,529,375 B2 | 3/2003 | Miyahara et al. | |
| 6,529,375 B2 * | 3/2003 | Miyahara et al. ............ | 361/697 |
| 6,744,631 B1 * | 6/2004 | Chuang et al. ......... | 361/679.48 |
| 7,113,399 B2 * | 9/2006 | Hisano et al. ................ | 361/688 |
| 7,310,227 B2 * | 12/2007 | Kusamoto et al. ........... | 361/695 |
| 7,325,590 B2 * | 2/2008 | Kim et al. .............. | 165/104.33 |
| 7,336,489 B1 * | 2/2008 | Chen et al. .................... | 361/700 |
| 7,405,930 B2 * | 7/2008 | Hongo et al. .......... | 361/679.48 |
| 2005/0103477 A1 * | 5/2005 | Kim et al. .............. | 165/104.33 |
| 2005/0276018 A1 * | 12/2005 | Moore et al. ................. | 361/695 |
| 2006/0232934 A1 * | 10/2006 | Kusamoto et al. ........... | 361/697 |
| 2007/0076370 A1 * | 4/2007 | Mongia et al. ............... | 361/690 |
| 2008/0019093 A1 * | 1/2008 | Hongo ........................ | 361/693 |

FOREIGN PATENT DOCUMENTS

| | | |
|---|---|---|
| CN | 2384366 | 6/2000 |
| CN | 1838027 | 9/2006 |
| CN | 1848039 | 10/2006 |
| JP | 233590-1998 | 9/1998 |
| JP | 87961-1999 | 3/1999 |
| JP | 227822-2000 | 8/2000 |

* cited by examiner

*Primary Examiner*—Jayprakash N Gandhi
*Assistant Examiner*—Robert Hoffberg
(74) *Attorney, Agent, or Firm*—Kunzler & McKenzie

(57) ABSTRACT

The present invention provides a portable computer in which an increase in temperature of a housing is suppressed. In the present invention, a guide plate is provided to suppress an increase in temperature of a bottom surface. When a cooling fan device operates, outside air taken in from inlet openings flows as an air current through a narrow flow path formed between the guide plate and the bottom surface. A flow velocity of the air current can be increased by narrowing the flow path, and heat exchange with the guide plate can be effectively performed, thereby sufficiently cooling a cooling surface. The cooled guide plate cools an air layer between the guide plate and the heat sink and thermally insulates between the air layer and the bottom surface.

17 Claims, 5 Drawing Sheets

HOUSING TEMPERATURE SUPPRESSING STRUCTURE IN ELECTRONIC DEVICE AND PORTABLE COMPUTER

CROSS-REFERENCES TO RELATED APPLICATIONS

This application claims priority to Japanese Patent Application Number 2006-293408 entitled "HOUSING TEMPERATURE SUPPRESSING STRUCTURE IN ELECTRONIC DEVICE AND PORTABLE COMPUTER" and filed on Oct. 30, 2006 for Fusanobu Nakamura, which is incorporated herein by reference.

BACKGROUND OF THE INVENTION

1. Field of the Invention

This invention relates to a technology of suppressing a housing temperature in an electronic device.

2. Description of the Related Art

In a portable computer such as a notebook personal computer (PC) or a personal digital assistant (PDA), performance of a semiconductor device, such as a central processing unit (CPU), a video chip, or a CPU bridge has been improved, resulting in increased heat generation. On the other hand, while the notebook PC is typically reduced in thickness or size, a packaging density of the semiconductor device in a housing is increased. Since an allowable temperature during an operation is specified for each semiconductor device, a cooling device, such as a cooling fan or a heat sink is provided in the notebook PC for cooling to maintain an allowable temperature.

FIG. 8 is a cross-sectional view showing a cooling device in a conventional notebook PC and a flow of air around this device. The cooling device is formed of a heat sink 359, a heat pipe 353, and a cooling fan 357 accommodated in a housing 311. The heat pipe 353 transmits heat from a semiconductor device having a large amount of heat generation, such as a main CPU or a video chip to the heat sink 359. The cooling fan 357 takes in air in the housing from an upper side and a lower side as indicated by an arrow A' and an arrow B', and discharges air from an exhaust opening 327 through the inside of the heat sink 359 as indicated by an arrow C'. The heat sink 359 diffuses heat transmitted through the heat pipe 353 into air passing through the inside.

A periphery of the exhaust opening 327 is hermetically sealed by a sealing material 371 to prevent a high-temperature air which has passed through the heat sink 359 from flowing back into the housing 311. Inlet openings 367 and 368 are provided at respective positions in a top cover 381 and a base cover 321. Since a part of the housing 311 except the inlet openings 367 and 368 are substantially hermetically sealed, outside air flows in from the inlet openings 367 and 368 to produce air currents indicated by arrows D' and E' when the cooling fan 357 operates. The air currents cool each semiconductor device on a circuit board 341 or other devices in the housing 311.

The cooling device shown in FIG. 8 has a structure where a negative pressure is formed in the housing 311 to take in outside air from the inlet openings 367 and 368 provided at the respective positions and the air is discharged to the outside of the housing through the heat sink. Therefore, flow paths or flow rates of the air currents D' and E' must be determined to allow effectively cooling components in the housing. The flow paths or the flow rates are determined to obtain an optimum cooling effect by repeating an experiment in which mainly positions and sizes of the inlet openings 367 and 368 are used as parameters.

Further, structural considerations may prevent the inlet opening 377a from being placed near the side surface like FIG. 9A, and so the inlet opening 377a is actually placed at a position on the cooling fan 357 side as depicted in FIG. 9B. In this case, since an air current indicated by an arrow H' flows, a volume of a heated air layer 375b is increased, and reducing a temperature of the housing becomes further difficult.

FIG. 9C shows an example where another inlet opening 377c is provided in a side surface of a base cover 321c. In this case, since an air current passes under the heat sink 359 as indicated by an arrow I', a heated air layer is not accumulated below the heat sink 359. However, high-temperature air immediately after discharge from the exhaust opening 327 is mixed into outside air taken in from the inlet opening 377c as indicated by an arrow J', and hence a temperature of an air current I' is increased, and a temperature of the base cover 321 cannot be reduced. Furthermore, in all of the examples depicted in FIGS. 9A to 9C, when the inlet openings 377a to 377c are newly provided near the cooling fan 357, flow paths or flow rates of the air currents flowing through other parts vary, and hence an overall air balance in the housing must be reexamined.

SUMMARY OF THE INVENTION

From the foregoing discussion, there is a need for a robust portable computer and housing temperature suppressing structure that suppress temperature. Beneficially, such an apparatus, system, and method would reliably suppress the temperature in electronic devices and portable computers.

The present invention has been developed in response to the present state of the art, and in particular, in response to the problems and needs in the art that have not yet been fully solved by currently available temperature suppression methods. Accordingly, the present invention has been developed to provide a portable computer and housing temperature suppressing structure for suppressing temperature that overcome many or all of the above-discussed shortcomings in the art.

The portable computer includes a main processor, a heat sink, a cooling fan device, a housing, and a guide plate. The heat sink includes an air inflow portion and an air outflow portion thermally coupled with the main processor. The cooling fan device sends air to the air inflow portion in the heat sink.

The housing includes a bottom surface in which an inlet opening, through which outside air taken in by the cooling fan devices passes, is formed below the heat sink and a side surface, in which an exhaust opening communicating with the air outflow portion in the heat sink, is formed. The guide plate is formed between the heat sink and the bottom surface of the housing with a gap between the guide plate and the bottom surface to cover the inlet opening.

The housing temperature suppressing structure includes a housing, a cooling fan device, a heat sink, an exhaust structure, and a cooling/thermal insulating insulation structure. The housing accommodates a heat generator. The cooling fan device includes an inlet portion in the housing. The heat sink absorbs heat from the heat generator to be diffused in air sent by the cooling fan.

The exhaust structure discharges air passing through the heat sink to the outside of the housing while avoiding contact with air in the housing. The cooling/thermal insulating insulation structure includes a bottom surface of the housing in which an inlet opening, through which outside air taken in by the cooling fan passes, is formed below the heat sink. In addition, the cooling/thermal insulating insulation structure includes a guide plate which is arranged between the heat sink and the bottom surface of the housing with a gap between the guide plate and the bottom surface of the housing to cover the inlet opening.

References throughout this specification to features, advantages, or similar language do not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The present invention suppresses temperature in electronic devices and portable computers. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

The present invention provides a portable computer suppressing an increase in a temperature of a housing. In addition, the present invention may be configured as a housing temperature suppressing structure in an electronic device.

Figure 1A:
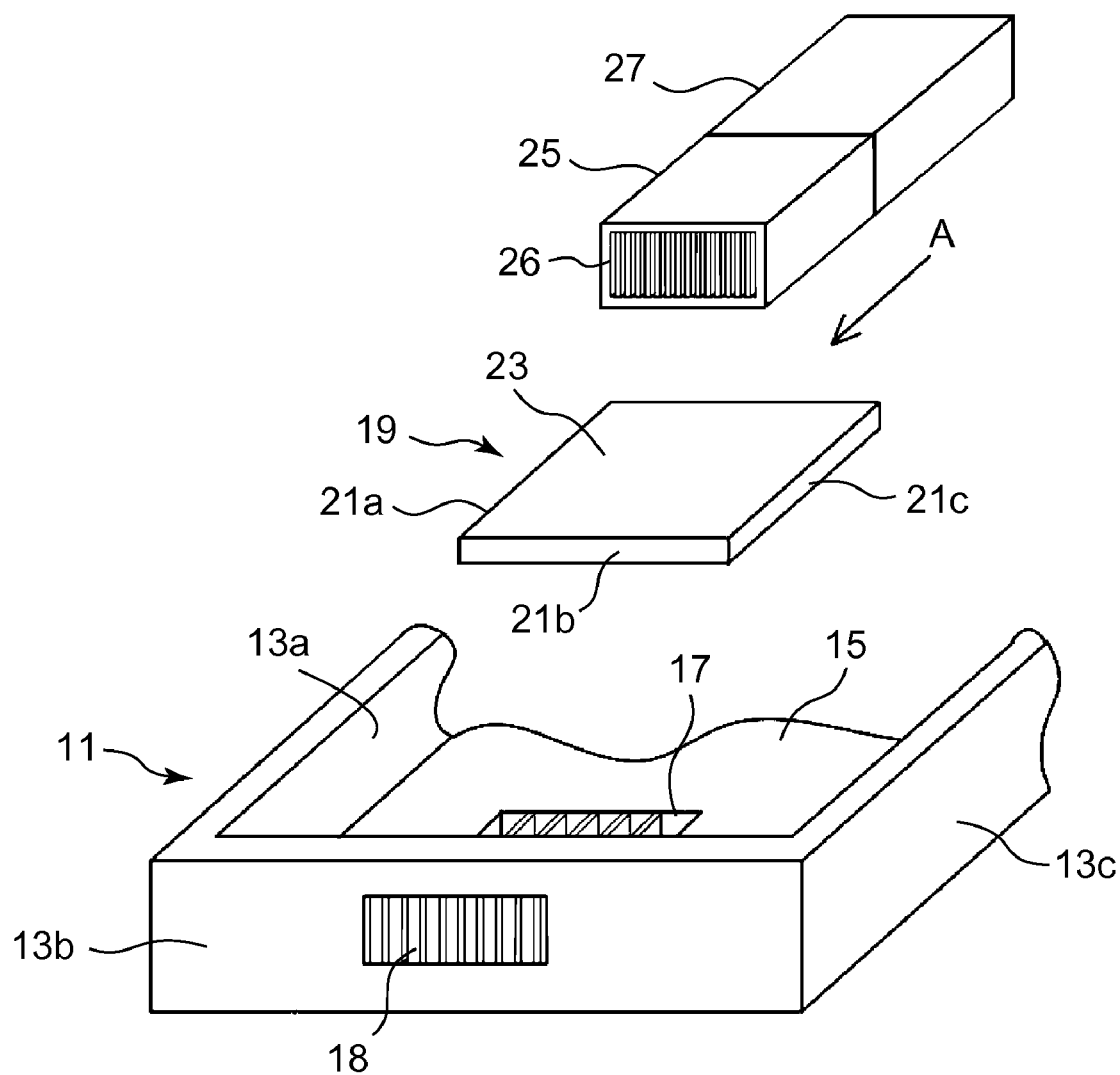
FIGS. 1A and 1B are schematic views of shapes of a housing, a guide plate, a heat sink, and a cooling fan device according to an embodiment of the present invention.
Figure 1B:
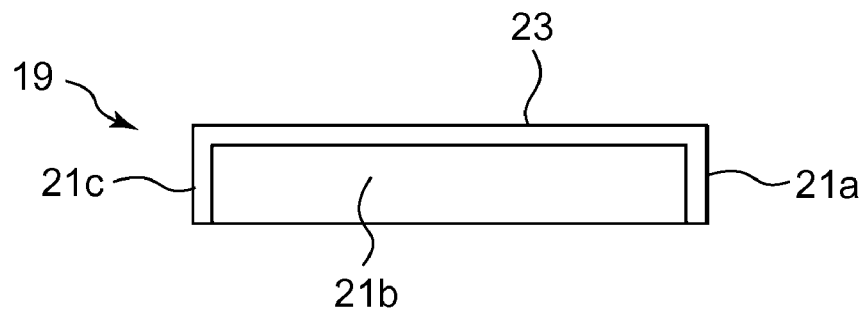

FIGS. 1A and 1B illustrate a housing temperature suppressing structure according to the present invention. FIG. 1A is an exploded perspective view of a housing temperature suppressing mechanism applied to an electronic device such as a portable computer. A housing 11 can accommodate a heat generator which generates heat during an operation, such as a CPU, a video chip, a CPU bridge, a magnetic disk device, or a power supply device. FIG. 1A shows just a part of the housing 11. The housing 11 includes side surfaces 13a, 13b, and 13c, and a bottom surface 15, and is configured to be covered with an non-illustrated upper surface. An inlet opening 17 is formed in the bottom surface 15, and an exhaust opening 18 is formed in the side surface 13b. The inlet opening 17 and the exhaust opening 18 pierce the inner space and the outside of the housing 11, louvers are respectively formed to these openings to prevent foreign matters from entering the housing.

A guide plate 19 is arranged on the bottom surface 15 of the housing to cover the inlet opening 17. FIG. 1B is a side view showing the guide plate 19 from a direction indicated by an arrow A. The guide plate includes a cooling surface 23 and side surfaces 21a, 21b, and 21c, and a surface on an arrow A side is opened without having a side surface. A heat sink 25 has an inner ventilation type structure which allows air to pass inside, and an air outflow portion 26 communicates with the exhaust opening 18. Here "communicates" means that a large part of air which has passed through the air outflow portion 26 is discharged through the exhaust opening 18 without coming into contact with air in the housing. The air outflow portion 26 of the heat sink 25 may be coupled with an inner surface side of the side surface 13b through a duct without bringing them into contact with each other.

An air inflow portion of the heat sink 25 is configured to take in exhaust air from a cooling fan device 27. The heat sink 25 absorbs heat emitted from a device having a large amount of heat generation such as a CPU, a video chip, or a CPU bridge among heat generators accommodated in the housing 11 through the heat pipe or absorbs heat by directly coming into contact with such a device, and diffuses heat into air which has passed through the inside.

The cooling fan device 27 is formed of a cooling fan, a motor, and a duct which accommodates these members. An exhaust side of the duct in the cooling fan device 27 communicates with an air inflow portion (not shown) of the heat sink 25, and the cooling fan device 27 can suck air in the housing to be sent to the heat sink 25. Here, "communicates" means that a negative pressure is formed in the housing 11 when the cooling fan device 27 operates. Although an explanation will be given on an example where an inlet portion of the cooling fan device 27 faces the bottom surface 15, a position of the inlet portion is not restricted thereto since it is sufficient for the cooling fan device 27 to enable forming a negative pressure in the housing 11 in the present invention. In the cooling fan device 27, forming a negative pressure in the housing 11 and discharging air from the exhaust opening 18 via the heat sink 25 can suffice.

A plurality of inlet openings are provided in the housing 11 besides the inlet opening 17, and outside air flows into the housing 11 via the respective inlet openings when the cooling fan device 27 operates. When the thus configured electronic device operates and the device accommodated in the housing 11 generates heat, heat produced from the high-heat generation device is absorbed by the heat sink to be discharged from the exhaust opening 18. Furthermore, heat generated by the other devices is diffused into air flowing in the housing 11 and then discharged from the exhaust opening 18 through the heat sink 25.

Figure 2:
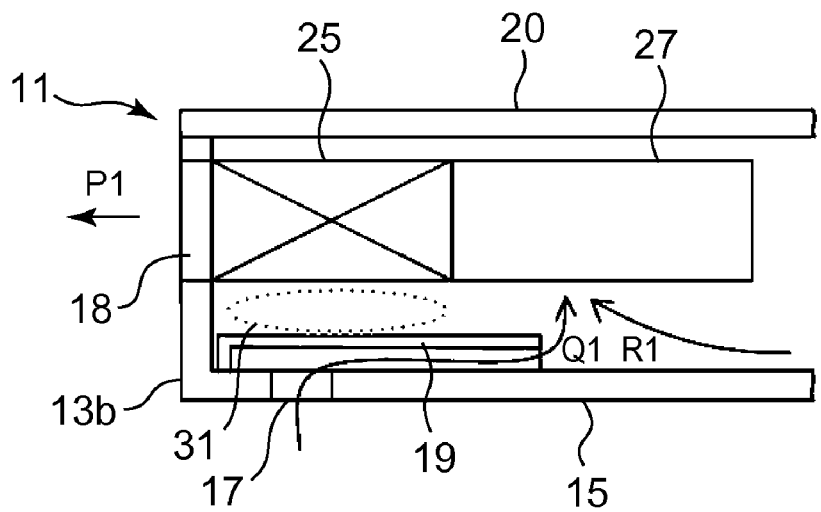
FIG. 2 is a cross-sectional view of FIG. 1A as seen from a side surface direction on a plane cutting across an inlet opening and being parallel to the side surface according to an embodiment of the present invention.

FIG. 2 is a cross-sectional view showing FIG. 1A from a side surface direction on a plane which cuts across the inlet opening 17 and is parallel to the side surface 13a. FIG. 2 shows an upper surface 20 of the housing 11 as different from FIG. 1A. The heat sink 25 and the cooling fan device 27 are provided with a predetermined gap from the bottom surface. When the electronic device operates, the heat sink 25 absorbs heat from the high-heat generation device, thereby increasing a temperature.

In the present invention, the guide plate 19 is provided to suppress an increase in temperature of the bottom surface 15. When the cooling fan device 27 operates, outside air taken in from the inlet opening 17 flows as an air current Q1 in a narrow flow path formed between the guide plate 19 and the bottom surface 15. Since the guide plate 19 can set a flow velocity and a flow rate to appropriate values by adjusting a sectional area or an air resistance of the flow path, the flow velocity can be maintained, and an air balance of an air current R1 in the other part in the housing 11 can be maintained.

The flow velocity of the air current Q1 can be increased by narrowing the flow path, and heat exchange with the guide plate 19 can be effectively performed, thus sufficiently cooling a cooling surface 23. The cooled guide plate 19 cools an air layer 31 between the guide plate 19 and the heat sink 25 and demonstrates a thermal insulating function between the air layer 31 and the bottom surface 15, thus suppressing an increase in temperature on the bottom surface 15 and the side surfaces 13a, 13b, and 13c. Since outside air taken in from the inlet opening 17 flows through the inlet portion of the cooling fan device 27 as the air current Q1, the cooling surface 23 placed on the side surface 13b side apart from the inlet opening 17 does not directly come into contact with the air current Q1. However, when the guide plate 19 is formed of a metal material or a plastic material having an excellent heat conductivity, the cooling surface 23 placed on the side surface 13b side apart from the inlet opening 17 is also indirectly cooled by the air current Q1, and hence the air layer 31 near the side surface 13b is also effectively cooled.

As explained above, the guide plate 19 according to this present invention demonstrates the effect of cooling the air layer below the heat sink 25, the thermal insulation effect with respect to the housing, and the effect of maintaining the air balance of the entire housing. It is desirable to arrange the inlet opening 17 at a position that is close to the side surface 13b as much as possible. The inlet opening 17 is desirably arranged in such a manner that the heat sink 25 can cover a range of right projection with respect to the bottom surface 15. Although the guide plate 19 has a chamber structure where its surface near the cooling fan device 27 alone is opened in the housing when the guide plate 19 is arranged in the housing 11, it is sufficient for the guide plate 19 to be arranged with a fixed distance from the bottom surface 15 in such a manner that the cooling surface 23 covers the inlet opening 17 in the present invention. In this case, a part of heated air of the air layer 31 from positions corresponding to the side surfaces 21a, 21b, and 21c serves as a part of the air current Q1 to be taken in by the cooling fan device 27.

A straightening vane which controls an air current in a correct direction may be provided in a flow path between the guide plate 19 and the bottom surface 15. Moreover, a pair of such housing temperature suppressing structures may be mounted to efficiently cool the housing including the main processor and the video chip having particularly large amounts of heat generation in the portable computer. In this case, the first heat sink is thermally coupled with the main processor, and the second heat sink is thermally coupled with the video chip. Additionally, when a first side surface including the exhaust opening of the first heat sink and a second side surface including the exhaust opening of the second heat sink are configured as surfaces adjacent to each other at a corner of the housing, a narrow space in the housing can be utilized to provide an effective cooling structure.

The present invention can provide the portable computer in which an increase in temperature of the housing is suppressed. Further, the present invention can provide the housing temperature suppressing structure in an electronic device.

Figure 3:
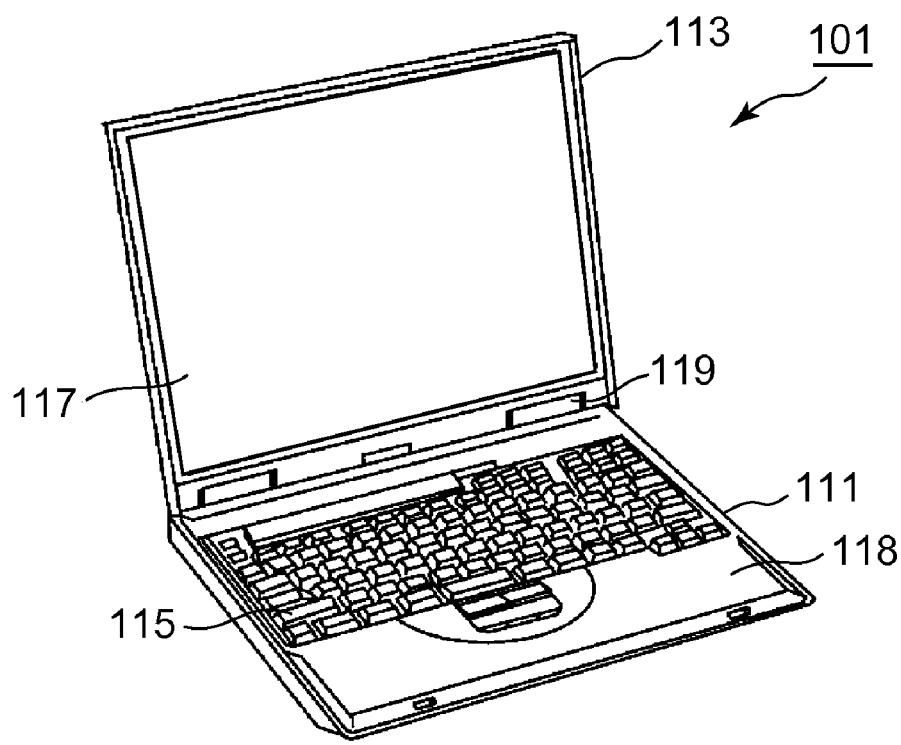
FIG. 3 is a perspective view of a notebook PC according to an embodiment of the present invention.

An embodiment according to the present invention will now be explained hereinafter with reference to the accompanying drawings. FIG. 3 is a perspective view of a notebook PC 101 according to an embodiment of the present invention. The notebook PC 101 includes a main-body-side housing 111 and a display-side housing 113 both having a substantially parallelepiped shape. The main-body-side housing 111 has an input section 115 comprising a keyboard and a pointing device, and the display-side housing 113 includes a display 117. Furthermore, the main-body-side housing 111 and the display-side housing 113 are coupled with each other through coupling portions 119 at respective ends, and these housings can swivel in directions along which they are opened/closed. When the main-body-side housing 111 and the display-side housing 113 are closed, the input section 115 and the display 117 are hidden inside and covered. Moreover, a palm rest 118 on which both hands of a user are placed when he/she operates the input section 115 is provided on an upper side of the main-body-side housing 111 close to the user. Since both hands are placed at a position on the palm rest 118 which is high with respect to the input section 115, wrists of the user can be maintained in a horizontal state, and deleterious effects, such as tendovaginitis can be eased.

Figure 4:
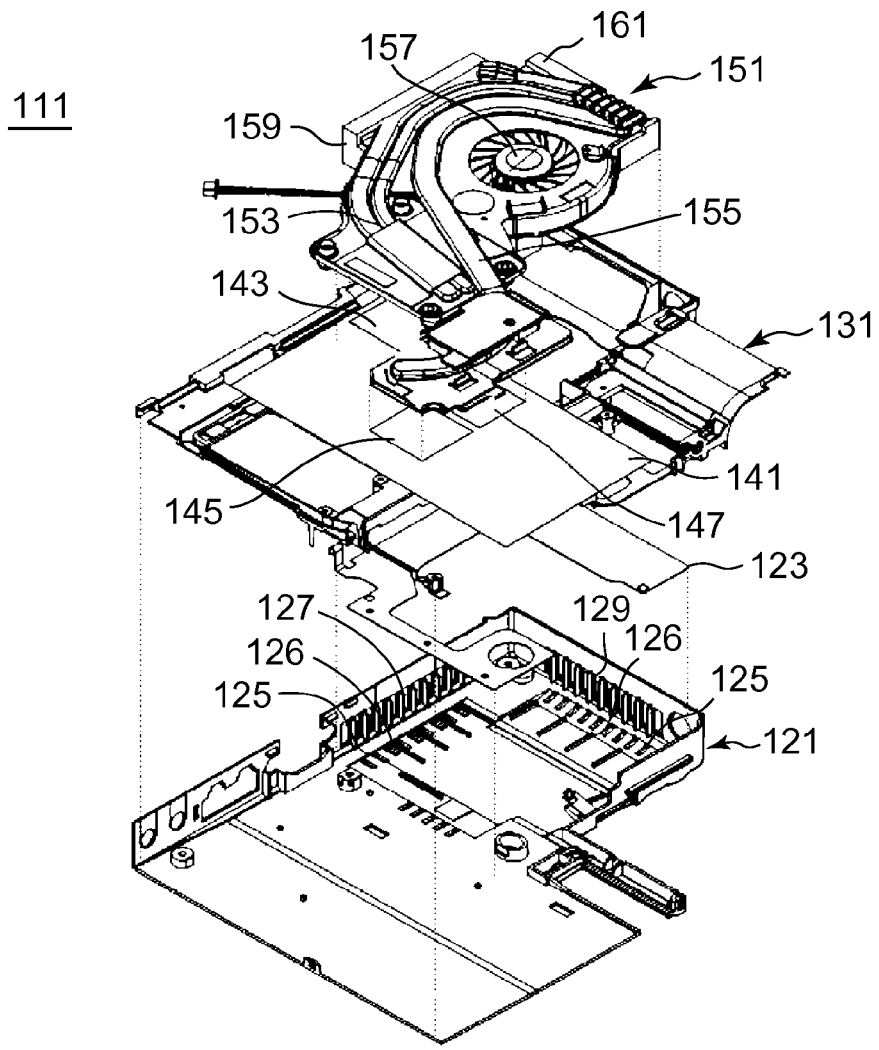
FIG. 4 is a schematic view showing the inside of a main-body-side housing, especially assembling a periphery of a cooling device in the notebook PC according to an embodiment of the present invention.

FIG. 4 is an exploded perspective view showing the inside of the main-body-side housing 111, especially assembling of parts around a cooling device. FIG. 4 depicts a state where a rear portion of the main-body-side housing 111 on the observer's left hand side is exploded in a direction along which a user can operate the input section 115 in an enlarged manner. A metal plate 123 having a wall thickness of approximately 0.1 mm is attached to a bottom surface of a base cover 121 constituting a bottom portion of an exterior of the main-body-side housing 111. A frame 131 is arranged on the plate 123, and a circuit board 141 is disposed on the frame 131. Inlet openings 125 are formed below a position of the bottom surface of the base cover 121 to which the plate 123 is attached, and an air gap having a width of approximately 1.0 mm is formed between the bottom surface of the base cover 121 and the plate 123. Therefore, outside air can be taken into the main-body-side housing 111 from the inlet openings 125 via this air gap.

Figure 5:
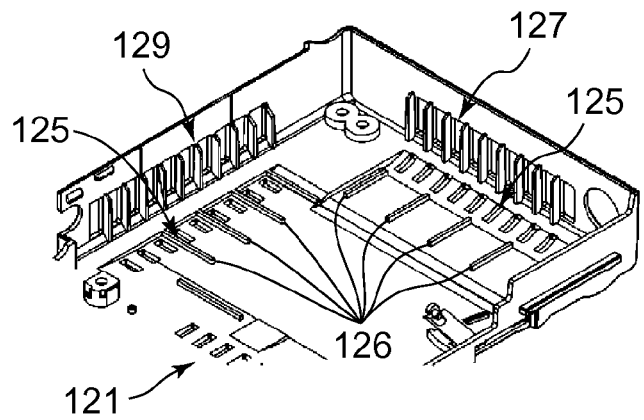
FIG. 5 is an enlarged schematic view showing a periphery of air inlet openings and straightening vanes in a base cover in the notebook PC according to an embodiment of the present invention.

FIG. 5 is an enlarged schematic view of a periphery of the inlet openings 125 and straightening vanes 126 in the base cover 121. The inlet openings 125 are formed as a plurality of small openings at position each of which is several cm away from the end of the bottom surface of the base cover 121 in accordance with positions of later-explained heat sinks 159 and 161. The inlet openings 125 are formed as the plurality of openings in order to prevent foreign matters from entering and/or further strengthen of the housing. The inlet opening 125 may be a single large opening configured as a cooling structure. The straightening vanes 126 are formed near the inlet openings 125. Each straightening vane 126 supports the plate 123 in such a manner that a gap between the base cover 121 and the plate 123 becomes uniform. At the same time, the straightening vane 126 adjusts a direction of an air current taken in from the inlet openings 125 and leads the air current toward an inlet portion of a later-explained fan device 157. Particulars of the inlet openings 125 and the straightening vanes 126 will be explained later.

Again referring to FIG. 4, on the circuit board 141 is mounted an electronic circuit to which many electronic components which are mainly integrated circuits having a central function of the notebook PC 1, e.g., a CPU 143, a video chip 145, a CPU bridge 147, a main memory (not shown), and others are disposed. Additionally, although not specifically depicted in FIG. 4, on the frame 131 are disposed, e.g., a hard disk drive (HDD), an optical drive, a PC card slot, a power supply device, and terminals for connection with a peripheral device or a network through various kinds of interfaces.

A cooling device 151 is arranged on the frame 131 and the circuit board 141. The cooling device 151 is formed of heat pipes 153 and 155, a cooling fan device (which will be simply referred to as a fan device hereinafter) 157, heat sinks 159 and 161, and others. The heat pipe 153 is configured to conduct heat of the CPU 143 to the heat sinks 159 and 161. The heat pipe 151 is configured to conduct heat of the video chip 145 and the CPU bridge 147 to the heat sinks 159 and 161. The fan device 157 and the heat sinks 159 and 161 are arranged on the plate 123.

The fan device 157 is formed of a motor, a centrifugal fan, and a duct which accommodates these members. Inlet portions are formed on upper and lower sides of the duct. Exhaust openings 127 are formed in the base cover 121 on the left side of the main-body-side housing 111 as seen from the front which is an exhaust direction of the heat sink 159, and exhaust openings 129 are formed in the base cover 121 on the rear side of the main-body-side housing 111 which is an exhaust direction of the heat sink 161. Air in the housing that is sucked from the inlet portion by the fan device 157 passes through the heat sinks 159 and 161 to be discharged to the outside from the exhaust openings 127 and 129. At this time, heat absorbed by the heat sinks is diffused into air that passes inside. The frame 131 is configured not to close the exhaust openings 127 and 129.

The above-described respective constituent parts are assembled on the base cover 121, and the input section 115 (not shown here) including the keyboard and the pointing device and the top cover (not shown) forming the upper part of the exterior are further disposed, thus constituting the main-body-side housing 111. It is to be noted that FIGS. 3 to 5 just show primary constituent parts and positional relationships concerning this embodiment in a simplified form in order to explain this embodiment. Although many additional components besides those explained above are used to constitute the notebook PC 101, persons skilled in the art know these components, so for simplicity a detailed explanation of the additional components is omitted. Shapes and an assembling method of the respective components are just an example, and one of skill in the art will recognize that other conformations are included in the scope of the invention.

Figure 6:
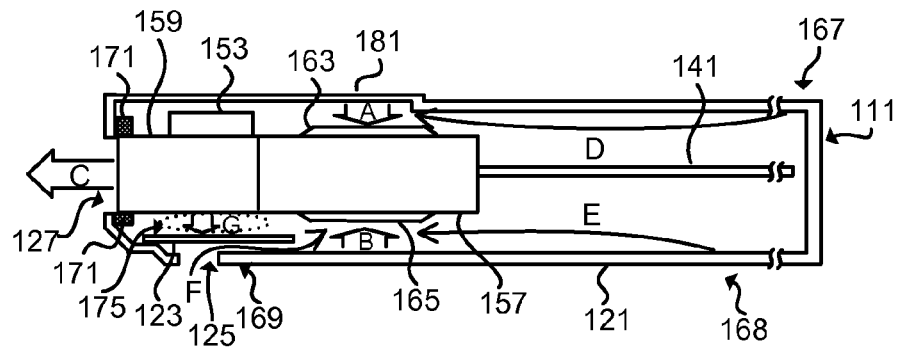
FIG. 6 is a cross-sectional view showing the cooling device and air currents around this device in the notebook PC according to an embodiment of the present invention.

FIG. 6 is a cross-sectional view showing the cooling device 151 and a flow of air around this device. FIG. 6 shows the heat sink 159 alone because it is a cross-sectional view, but the heat sink 161 has the same structure. It is to be noted constituent parts, such as the frame 131, may be omitted to simplify FIG. 6. An inlet portion 163 is provided on the upper side of the fan device 157, and an inlet portion 165 is provided on the lower side of the fan device 157. Air in the main-body-side housing 111 taken in from these inlet portions 163 and 165 (arrows A and B) is sent to the heat sinks 159 and 161, and discharged to the outside from the exhaust openings 127 and 129 (an arrow C). It is to be noted that a sealing material 171 is provided around the exhaust opening 127 and a sealing material is also provided around the exhaust opening 129 so that the periphery of each exhaust opening 127 or 129 is hermetically sealed.

A plurality of inlet openings 167 are provided at respective positions in the top cover 181, and a plurality of inlet openings 168 are provided at respective positions in the base cover 121. The part of the main-body-side housing 111 except the inlet openings 167 and 168 is substantially hermetically sealed. Therefore, when the fan device 157 operates, an air pressure in the main-body-side housing 111 is lower than the outside, and air currents in directions indicated by arrows D and E in FIG. 6 are generated. The air currents cool the respective components on the circuit board 141 and any other devices in the main-body-side housing 111.

A function of suppressing a temperature of the housing by the cooling structure according to the embodiment of the present invention will now be explained. In FIG. 6, when the fan device 157 is operated, a negative pressure is formed in the main-body-side housing 111, an air current indicated by an arrow F is generated in an air gap between the bottom surface of the base cover 121 and the plate 123, and air currents indicated by the arrows D and E are generated in the housing 111. Since the air current indicated by the arrow F passes through the narrow air gap as compared with the air currents indicated by the arrows D and E, a flow rate of air is small, but a flow velocity of air is high. Therefore, cold outside air can effectively exchange heat with the plate 123. The air current indicated by the arrow F passes through an air gap 169 to be led toward the inlet portion 165 of the fan device 157 by the straightening vanes 126 formed around the inlet openings 125 while coming into contact with the plate 123 over a distance of approximately 1 to 4 cm. Further, the air current indicated by the arrow F joins the air currents indicated by the E near the inlet portion 165, and is finally discharged to the outside of the main-body-side housing 111 as an air current indicated by an arrow C.

Although heat conducted to the heat sinks 159 and 161 by the heat pipes 153 and 155 is largely discharged to the outside of the main-body-side housing 111 by the air current indicated by the arrow C, a part of the heat is radiated in a direction of an arrow G toward the lower side of the main-body-side housing 111, thereby increasing a temperature of an air layer 175. Radiant heat from the heat sinks 159 and 161 and conductive heat from the heated air layer 175 increase a temperature of the plate 123. However, since the air current indicated by the arrow F flowing through the air gap 169 cools the plate 123, heat conducted to the plate 123 is diffused into the air current indicated by the arrow F. The plate 123 is formed of a metal having excellent thermal conductivity. Therefore, even if a part of the plate 123 placed on the exhaust opening 127 side apart from each inlet opening 125 does not directly come into contact with the air current indicated by the arrow F, heat of this part moves to a position on the plate 123 which is in contact with the air current indicated by the arrow F and is diffused into the air current indicated by the arrow F. Furthermore, the air current in the air gap 169 is exchanged with outside air at a relatively high flow velocity, thereby demonstrating the thermal insulating function with respect to the base cover 121. Therefore, an increase in temperature at positions corresponding to the lower parts of the heat sinks 159 and 161 in the base cover 121 can be suppressed.

In values actually measured by the present inventor in a laboratory, a maximum value of a surface temperature of the main-body-side housing 111 can be lowered approximately 5 degrees Celsius from a conventional value by adopting the cooling structure according to this embodiment. According to this cooling structure, the number of components is increased by just one which corresponds to the plate 123 as compared with the number of components in the conventional example, and forming the inlet openings 125 in the base cover 121 can suffice, thus reducing cost. Moreover, in regard to a space which is increased by introducing this cooling structure, arranging the plate 123 having a wall thickness of approximately 0.1 mm below the cooling device 151 and forming the air gap 169 of approximately 1.0 mm can suffice. Therefore, an influence on a reduction in size and weight of the housing, especially a reduction in thickness is small. Additionally, a flow rate of air in the air current indicated by the arrow F passing through the air gap 169 can be decreased, the air balance in the main-body-side housing 111 is not degraded, and the cooling function by the air currents indicated by the arrows D and arrow E is not deteriorated.

It is to be noted that the structure of coupling the high-heat generation device, such as the CPU 143 is coupled with each heat sink through the heat pipe is adopted while considering a degree of freedom with respect to a design, but the high-heat generation device may be directly coupled with each heat sink. Although the centrifugal fan is used in the cooling fan device, any other fan may be adopted. Further, the cooling fan device does not have to be directly coupled with each heat sink or the each heat sink does not have to be directly coupled with the exhaust opening as long as a negative pressure can be formed in the housing to effect exhaust, and hence these members may be coupled through, e.g., a duct.

Figure 7:
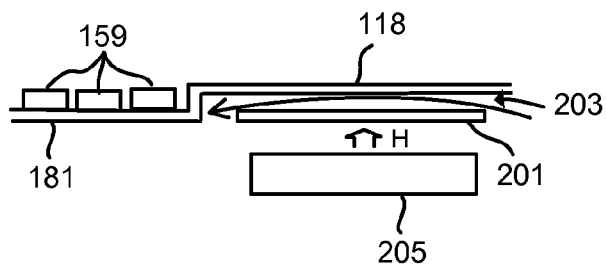
FIG. 7 is a conceptual view showing a method of cooling a palm rest in the notebook PC according to an embodiment of the present invention.
Figure 8:
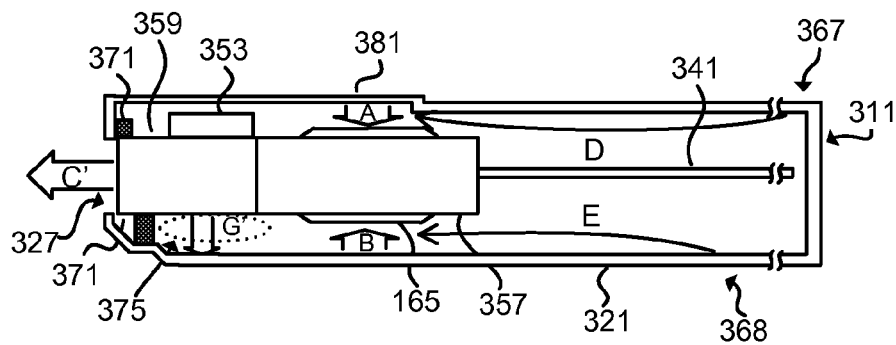
FIG. 8 is a cross-sectional view showing a cooling device and air currents around the cooling device in a conventional notebook PC.
Figure 9A:
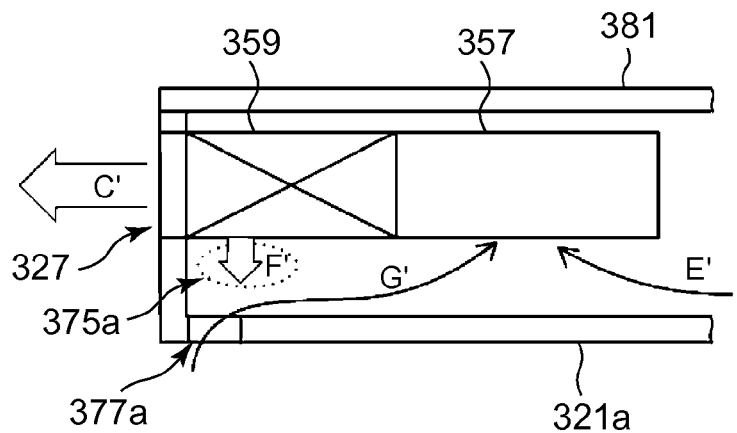
FIGS. 9A-9C are conceptual views showing an embodiment where another inlet opening is provided at a position around a heat sink.
Figure 9B:
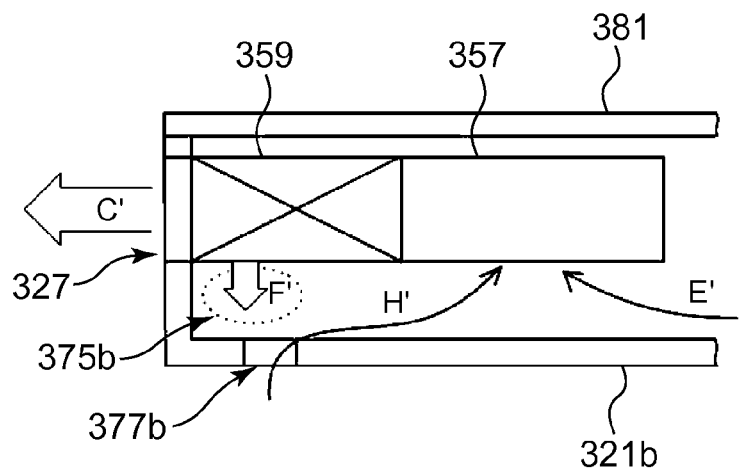
Figure 9C:
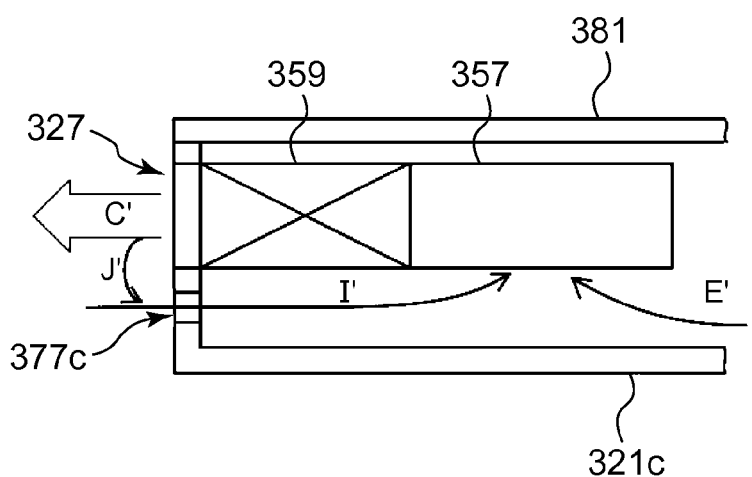

The method according to the present invention can be applied to other positions than that near the heat sink. FIG. 7 is a conceptual view showing a method of cooling the palm rest in the notebook PC 101 by applying the method according to the present invention. Since the palm rest 118 is in contact with hands of a user while he/she is operating the input section 115, an increase in temperature of this position is undesirable. However, a constituent part 205 which readily generates heat, e.g., a magnetic disk device or a power supply device may be present under the palm rest 118. Since an amount of heat generation from such a constituent part 205 is smaller than that from, e.g., the video chip, the constituent part 205 is usually cooled by an air current in the housing without using the heat pipe and others. FIG. 7 shows a cross section near the palm rest 118. A metal plate 201 is provided on the top cover 181 at a position corresponding to the rear side of the palm rest 118. An air gap 203 of approximately 1.0 mm is formed between the rear surface of the top cover 181 and the plate 201. When an air current indicated by an arrow I generated by the cooling fan device (not shown) is passed through the air gap 203, a thermal insulating N function of the air gap 203 itself, a function of cooling the plate 201 by the air current indicated by the arrow I, and a function of diffusing heat to the air current indicated by the arrow I from the plate 201 are produced. These functions suppress radiant heat of an arrow H generated from the constituent part 205 and conducted to the plate 201 and conductive heat from a heated air layer present between the plate 201 and the constituent part from being conducted to the palm rest 118.

It is to be noted that the present invention has been explained with reference to the specific illustrated embodiment, but the present invention is not restricted to the illustrated embodiment. It is needless to say that any known structure can be adopted as long as the effect of the present invention can be demonstrated.

What is claimed is:

1. A portable computer having:
   a main processor;
   a heat sink comprising an air inflow portion and an air outflow portion thermally coupled with the main processor;
   a cooling fan device which sends air from a cooling fan device inlet portion to the air inflow portion in the heat sink;
   a housing with a housing surface comprising a housing bottom surface in which an inlet opening, through which outside air taken in by the cooling fan devices passes, is formed directly below the heat sink and a housing side surface in which an exhaust opening communicating with the air outflow portion in the heat sink is formed; and
   a guide plate which is formed between the heat sink and the housing bottom surface with a gap between the guide plate and the housing bottom surface, the guide plate covering the inlet opening and comprising a cooling surface extending from the housing surface over the inlet opening to the cooling fan device inlet portion and straightening vanes extending from the cooling surface to the housing bottom surface, the cooling surface absorbing heat radiated from the heat sink and diffusing the absorbed heat into air flowing from the inlet opening to the cooling fan device inlet portion.

2. The portable computer according to claim 1, wherein the guide plate is formed of a material selected from a metal material and a plastic material and the absorbed heat is diffused from the cooling surface into the air flowing from the inlet opening to the inlet portion of the cooling fan device over a distance in the range of one to four centimeters.

3. The portable computer according to claim 1, wherein the cooling surface, the straightening vanes, the housing bottom surface, and the housing side surface are formed into a chamber structure in which a part near the inlet portion of the cooling fan device alone is opened to the chamber structure and to communicate with the inlet opening.

4. The portable computer according to claim 1, wherein the cooling fan device has an exhaust portion communicating with the air inflow portion in the heat sink.

5. The portable computer according to claim 1, wherein a periphery of the air outflow portion in the heat sink is hermetically sealed with respect to the housing, and an accumulated air layer is formed between a lower part of the heat sink and the guide plate cooling surface when the cooling fan device operates.

6. The portable computer according to claim 1, wherein the straightening vanes controlling a direction of the air flowing from the inlet opening to the inlet portion of the cooling fan device.

7. The portable computer according to claim 1, further comprising a plurality of inlet openings formed in the housing through which outside air taken in by the cooling fan device.

8. The portable computer according to claim 1, wherein the inner space of the housing is maintained to have a negative pressure with respect to outside air by an operation of the cooling fan device.

9. The portable computer according to claim 1, wherein the heat sink is coupled with the main processor through a heat pipe.

10. A portable computer having:
a main processor;
a video chip;
a first heat sink comprising an air inflow portion and an air outflow portion thermally coupled with the main processor;
a second heat sink comprising an air inflow portion and an air outflow portion thermally coupled with the video chip;
a cooling fan device which sends air from an inlet portion of the cooling fan device to the air inflow portion in the first heat sink and the air inflow portion in the second heat sink, respectively;
a housing with a housing surface comprising a housing bottom surface in which a first inlet opening, through which outside air taken in by the cooling fan device passes, is formed directly below the first heat sink and a second inlet opening, through which outside air taken in by the cooling fan device passes, is formed directly below the second heat sink, a first housing side surface in which a first exhaust opening communicating with the air outflow portion in the first heat sink is formed, and second housing side surface in which a second exhaust opening communicating with the air outflow portion in the second heat sink is formed; and
a guide plate which is arranged between the first heat sink, the second heat sink, and the housing bottom surface with a gap between the guide plate and the housing bottom surface, the guide plate covering the first inlet opening and the second inlet opening and comprising a cooling surface extending from the housing surface over the first inlet opening and the second inlet opening to the cooling fan device inlet portion and straightening vanes extending from the cooling surface to the housing bottom surface, the cooling surface absorbing heat radiated from the heat sink and diffusing the absorbed heat into air flowing from the first inlet opening and the second inlet opening to the cooling fan device inlet portion.

11. The portable computer according to claim 10, wherein the main processor is coupled with the first heat sink through a first heat pipe, and the video chip is coupled with the second heat sink through a second heat pipe.

12. The portable computer according to claim 10, wherein the first housing side surface is adjacent to the second housing side surface; surface at a corner of the housing.

13. The portable computer according to claim 10, wherein a periphery of the air outflow portion in the first heat sink and a periphery of the air outflow portion in the second heat sink are respectively hermetically sealed with respect to the housing, and an accumulated air layer is formed between a lower part of the first heat sink, a lower part of the second heat sink, and the guide plate and the absorbed heat is diffused from the cooling surface into the air flowing from the first inlet opening and second inlet opening to the inlet portion of the cooling fan device over a distance in the range of one to four centimeters.

14. A housing temperature suppressing structure in an electronic device, having:
a cooling fan device comprising an inlet portion and sending air from the cooling fan device inlet portion to an air inflow portion of a heat sink;
a housing accommodating a heat generator with a housing surface comprising a housing bottom surface and a housing side surface; in which an exhaust opening communicating with an air outflow portion in the heat sink is formed;
the heat sink comprising the air inflow portion and absorbing heat from the heat generator and diffusing the heat in the air sent by the cooling fan device to the air inflow portion;
an exhaust structure which discharges the air passing through the heat sink to the outside of the housing while avoiding contact with air in the housing; and
a cooling/thermal insulating insulation structure comprising the housing bottom surface in which an inlet opening, through which outside air taken in by the cooling fan device passes, is formed directly below the heat sink, and a guide plate which is arranged between the heat sink and the housing bottom surface with a gap between the guide plate and the housing bottom surface, the guide plate covering the inlet opening and comprising a cooling surface extending from the housing surface over the inlet opening to the cooling fan device inlet portion and straightening vanes extending from the cooling surface to the housing bottom surface, the cooling surface absorbing heat radiated from the heat sink and diffusing the absorbed heat into air flowing from the inlet opening to the cooling fan device inlet portion.

15. The housing temperature suppressing structure according to claim 14, wherein the air flowing between the guide plate and the housing bottom surface from the inlet opening to the inlet portion of the cooling fan device thermally insulates a space between the heat sink and the housing bottom surface.

16. The housing temperature suppressing structure according to claim 14, wherein the exhaust structure includes an exhaust opening formed in the housing side surface, and a communication structure which hermetically seals and communicates with the exhaust opening and an air outflow portion in the heat sink.

17. The housing temperature suppressing structure according to claim 14, wherein the guide plate forms a flow path in which outside air taken in from the inlet opening is prevented from coming into contact with air in the housing, the flow path being extended from the inlet opening to a part near the inlet portion of the cooling fan device.

* * * * *